(12) United States Patent
Satou et al.

(10) Patent No.: US 11,659,675 B2
(45) Date of Patent: May 23, 2023

(54) ELECTRONIC DEVICE AND ELECTRONIC DEVICE MANUFACTURING METHOD

(71) Applicant: KYOCERA Corporation, Kyoto (JP)

(72) Inventors: Takafumi Satou, Yokohama (JP); Takeyuki Dohda, Yokohama (JP); Kenji Ishibashi, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 217 days.

(21) Appl. No.: 16/879,174

(22) Filed: May 20, 2020

(65) Prior Publication Data

US 2020/0383225 A1 Dec. 3, 2020

(30) Foreign Application Priority Data

May 29, 2019 (JP) .............................. JP2019-100543

(51) Int. Cl.
*H05K 5/00* (2006.01)
*H05K 5/06* (2006.01)

(52) U.S. Cl.
CPC ............. *H05K 5/06* (2013.01); *H05K 5/0095* (2013.01)

(58) Field of Classification Search
CPC ................................. H05K 5/06; H05K 5/0095
USPC ......................................................... 361/518
See application file for complete search history.

(56) References Cited

U.S. PATENT DOCUMENTS 6,407,925 B1* 6/2002 Kobayashi ........... H05K 5/0052
361/752
6,757,168 B2* 6/2004 Yatougo ............. H05K 7/20145
361/692
7,561,435 B2* 7/2009 Kamoshida ............ H05K 5/062
361/728
7,570,496 B2* 8/2009 Chen ...................... H05K 9/006
361/753
8,139,376 B2* 3/2012 Sanroma ............. H05K 9/0037
361/753
9,013,889 B2* 4/2015 Tamura .................. H05K 5/069
361/752
9,723,740 B2* 8/2017 Yang ................... B60R 16/0239
2001/0048586 A1 12/2001 Itou et al.
2004/0095732 A1 5/2004 Azumi et al.
2013/0070432 A1* 3/2013 Kawai ................. H05K 5/0069
361/752

(Continued)

FOREIGN PATENT DOCUMENTS

EP    1874103 A2 *  1/2008  .......... H05K 5/0052
EP    2034811 A2 *  3/2009  .......... H05K 5/0052
JP    2001-337743 A   12/2001

(Continued)

*Primary Examiner* — Anatoly Vortman
(74) *Attorney, Agent, or Firm* — Procopio Cory Hargreaves and Savitch LLP

(57) ABSTRACT

An electronic device comprising: a first case in which a groove is arranged along an outer circumference; a second case that overlaps with the first case and that has a rib extending toward a bottom face of the groove; and a seal member that is sandwiched between the bottom face and the rib, wherein the groove includes: a first side wall that is arranged on one end portion of the bottom face; and a second side wall that is arranged on other end portion of the bottom face, a height of the first side wall from the bottom face is lower than a height of the second side wall, and the first side wall does not come into contact with the second case.

19 Claims, 6 Drawing Sheets

(56) References Cited

U.S. PATENT DOCUMENTS

2017/0257964 A1* 9/2017 Ishikawa ................ H05K 5/065
2018/0222408 A1* 8/2018 Shigyo ................ B60R 16/0239

FOREIGN PATENT DOCUMENTS

| JP | 2004-166413 A | | 6/2004 | |
|----|---------------|---|--------|---|
| JP | 2006-261210 A | | 9/2006 | |
| JP | 2014086644 A | * | 5/2014 | |
| JP | 3191032 U | * | 6/2014 | ........... H05K 5/0026 |
| JP | 2017-168695 A | | 9/2017 | |
| JP | 2017168695 A | * | 9/2017 | |
| WO | WO-2015146366 A1 | * | 10/2015 | ........... H05K 5/0026 |
| WO | 2016/031511 A1 | | 3/2016 | |
| WO | WO-2016031511 A1 | * | 3/2016 | ........... H05K 5/0017 |

* cited by examiner

[//]: # (col 1)

ELECTRONIC DEVICE AND ELECTRONIC DEVICE MANUFACTURING METHOD

CROSS-REFERENCE TO RELATED APPLICATION(S)

The present application claims priority under 35 U.S.C § 119 to Japanese Patent Application No. 2019-100543, filed in Japan on May 29, 2019, entitled "ELECTRONIC DEVICE AND ELECTRONIC DEVICE MANUFACTURING METHOD". The content of which is incorporated by reference herein in its entirety.

BACKGROUND

1. Technical Field

The present application relates to an electronic device and an electronic device manufacturing method.

2. Description of the Related Art

Some electronic devices, such as mobile communication devices, are waterproofed. For example, it is known that a waterproof structure in which a packing as an elastic body is arranged in mating parts of housings and the packing is sandwiched and compressed by the housings.

As described above, in the structure in which the packing is arranged between the housings, it is necessary to perform operation of setting a ring-shape packing in the housings. Further, if an amount of compression of the packing is not appropriate, a gap may be generated, so that waterproof property may be reduced or durability of the packing may be reduced.

Here, as a structure for sealing the mating parts of the housings, a structure in which a liquid seal material is applied and cured to seal the mating parts has been known. The seal material includes an ultraviolet curable type that is cured by being irradiated with ultraviolet light and a hot-melt type that is applied by being melted at high temperature. With use of the liquid seal material, it is not necessary to manufacture a ring-shape packing, so that it is possible to simplify manufacturing. If the liquid seal material is used, dimensional variation may occur at the time of setting in the housings, so that sealing property of the seal member may be reduced. Further, if an amount of supply of the seal material increases, the seal material may be leaked to other regions.

SUMMARY

It is an object of the present disclosure to at least partially solve the problems in the conventional technology.

An electronic device according to one embodiment includes a first case in which a groove is arranged along an outer circumference, the groove including a first side wall that is arranged on one end portion of a bottom face and a second side wall that is arranged on another end portion of the bottom face, a height of the first side wall from the bottom face being lower than a height of the second side wall, a second case that overlaps with the first case, the second case not coming into contact with the first side wall and having a rib extending toward the bottom face of the groove, and a seal member that is sandwiched between the bottom face and the rib.

A method for manufacturing an electronic device according to one embodiment is disclosed. The method includes pouring a liquid seal material into a groove that is arranged in a first case along an outer circumference of the first case, curing the seal material, and bringing a rib and the seal material into contact with each other by mating and overlapping the first case and a second case, the second case including the rib at a position facing the groove, in such a manner that the rib extends toward a bottom surface of the groove. The groove includes a first side wall that is arranged on one end portion of the bottom face, and a second side wall that is arranged on another end portion of the bottom face, a height of the first side wall from the bottom face is lower than a height of the second side wall, and the first side wall does not come into contact with the second case.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Embodiments for carrying out the present application will be described in detail below with reference to the drawings. In the following, a smartphone will be described as one example of a device that includes a touch screen.

An entire configuration of a smartphone 1 according to some embodiments will be described below with reference to FIG. 1 to FIG. 3. The smartphone 1 performs wireless communication using a communication unit and transmits/receives calls and data. A communication method supported by the communication unit includes a wireless communication standard. The wireless communication standard includes, for example, cellular phone communication standards, such as 2G, 3G, 4G, and 5G. Examples of the cellular phone communication standards include Long Term Evolution (LTE), Wideband Code Division Multiple Access (W-CDMA), CDMA2000, Personal Digital Cellular (PDC), Global System for Mobile Communications (GSM (registered trademark)), and Personal Handy-phone System (PHS). Further, examples of the wireless communication standard include Worldwide Interoperability for Microwave Access (WiMAX), IEEE802.11, Bluetooth (registered trademark), Infrared Data Association (IrDA), Near Field Communication (NFC), and Wireless Personal Area Network (WPAN). A communication standard for WPAN includes, for example, ZigBee (registered trademark). The communication unit may support one or a plurality of the communication standards as described above. The communication unit may support wired communication. The wired communication includes, for example, Ethernet (registered trademark), Fiber Channel, and the like.

The smartphone 1 further includes a storage and a controller for controlling and realizing various kinds of operation. The storage stores therein programs and data. The storage may be used as a work area for temporarily storing a processing result of the controller. The storage may include an arbitrary non-transitory storage medium, such as a semiconductor storage medium and a magnetic recording medium. The storage may include a plurality of kinds of storage media. The storage may include a combination of a portable storage medium, such as a memory card, an optical disk, or a magneto optical disk, and a storage medium reader. The storage may include a storage device, such as a Random Access Memory (RAM), which is used as a temporary storage area. The controller is an arithmetic processing device. The arithmetic processing device includes, for example, a Central Processing Unit (CPU), a System-on-a-chip (SoC), a Micro Control Unit (MCU), and a Field-Programmable Gate Array (FPGA), but is not limited thereto. The controller integrally controls operation of the smartphone 1 and realizes various functions.

Figure 1:
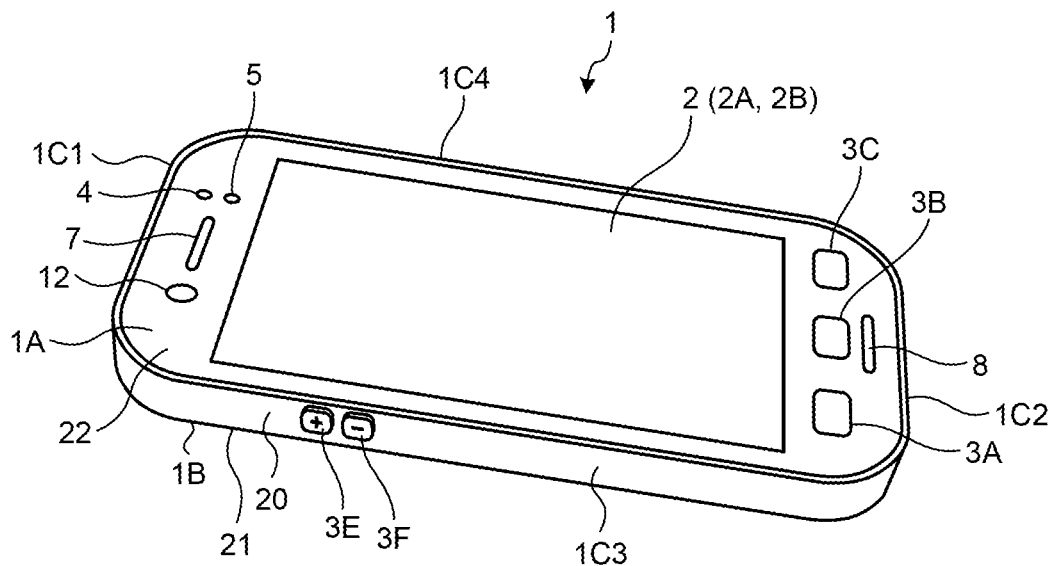
FIG. 1 is a perspective view of a smartphone according to some embodiments.
Figure 2:
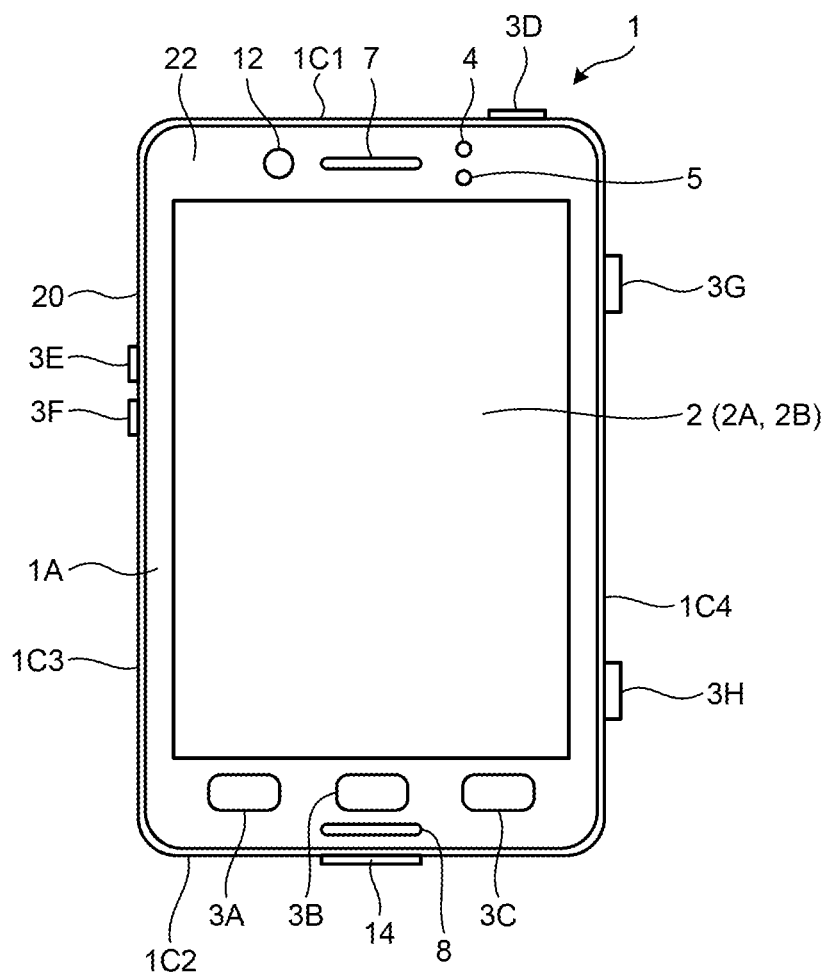
FIG. 2 is a front view of the smartphone.
Figure 3:
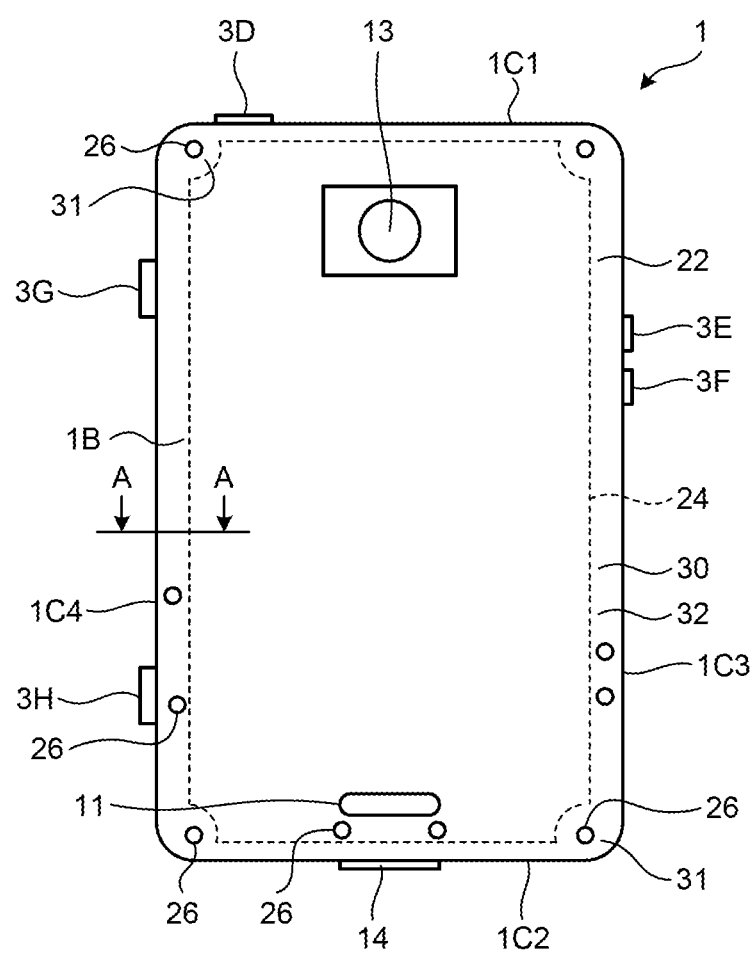
FIG. 3 is a back view of the smartphone.

As illustrated in FIG. 1 to FIG. 3, the smartphone 1 includes a housing 20. The housing 20 is a structure that prevents water from entering an internal area. The housing 20 is a waterproof structure. The structure of the housing 20 will be described later. The housing 20 includes a front face 1A, a back face 1B, and side faces 1C1 to 1C4. The front face 1A is a front surface of the housing 20. The back face 1B is a back surface of the housing 20. The side faces 1C1 to 1C4 are side surfaces that connect the front face 1A and the back face 1B. In the following, the side faces 1C1 to 1C4 may be collectively referred to as a side face 1C without specifying each of the faces.

The smartphone 1 includes a touch screen display 2, buttons 3A to 3C, an illuminance sensor 4, a proximity sensor 5, a receiver 7, a microphone 8, and a camera 12 on the front face 1A. The smartphone 1 includes a speaker 11 and a camera 13 on the back face 1B. The smartphone 1 includes buttons 3D to 3H and a connector 14 on the side face 1C. In the following, the buttons 3A to 3H may be collectively referred to as a button 3 without specifying each of the buttons.

The touch screen display 2 includes a display 2A and a touch screen 2B. In the example illustrated in FIG. 1, the display 2A and the touch screen 2B have approximately rectangular shapes, but the shapes of the display 2A and the touch screen 2B are not limited to this example. Each of the display 2A and the touch screen 2B may be formed in any shape, such as a square shape or a circular shape. In the example illustrated in FIG. 1, the display 2A and the touch screen 2B are positioned in an overlapping manner, but the positions of the display 2A and the touch screen 2B are not limited to this example. The display 2A and the touch screen 2B may be arranged side by side or arranged at separate positions, for example. In the example illustrated in FIG. 1, long sides of the display 2A extend along long sides of the touch screen 2B, and short sides of the display 2A extend along short sides of the touch screen 2B, but the way of overlapping between the display 2A and the touch screen 2B is not limited to this example. When the display 2A and the touch screen 2B are positioned in an overlapping manner, one or a plurality of the sides of the display 2A may be arranged so as not to extend along any of the sides of the touch screen 2B, for example.

The display 2A includes a display device, such as a Liquid Crystal Display (LCD), an Organic Electro-Luminescence Display (OELD), or an Inorganic Electro-Luminescence Display (IELD). The display 2A displays an object, such as a character, an image, a symbol, and a graphic.

The touch screen 2B detects touch of a finger, a pen, a stylus pen, or the like on the touch screen 2B. The touch screen 2B is able to detect positions on the touch screen 2B touched with a plurality of fingers, a pen, a stylus pen, or the like.

A detection method of the touch screen 2B may be an arbitrary method, such as a capacitance method, a resistance film method, a surface acoustic wave method, an infrared method, and a load sensing method. In the following description, for simplicity of explanation, it is assumed that a user touches the touch screen 2B with a finger in order to operate the smartphone 1.

The smartphone 1 determines a type of a gesture on the basis of at least one of touch detected by the touch screen 2B, a position at which the touch is detected, a change of the position at which the touch is detected, an interval between detections of touch, and the number of detections of touch. The gesture is operation performed on the touch screen 2B. Examples of the gesture determined by the smartphone 1 include touch, long touch, release, swipe, tap, double tap, long tap, drag, flick, pinch-in, and pinch-out, but are not limited thereto.

The button 3 is operated by a user. The button 3 includes the buttons 3A to 3H. The controller detects operation on the button 3 in cooperation with the button 3. Examples of the operation on the button 3 include click, double click, triple click, push, and multiple push, but are not limited thereto.

The buttons 3A to 3C are, for example, a home button, a back button, or a menu button. The button 3D is, for example, a power on/off button of the smartphone 1. The button 3D may also function as a sleep/sleep-off button. The buttons 3E and 3F are, for example, sound volume buttons. The button 3G is, for example, a power button. The button 3H is, for example, a shutter button. In some embodiments, the buttons 3E and 3F are arranged on the side face 1C3. The buttons 3G and 3H are arranged on the side face 1C4. Further, the button 3G is arranged on the side face 1C1 side relative to the button 3H. Therefore, the button 3H is arranged on the side face 1C2 side relative to the button 3G.

The illuminance sensor 4 detects illuminance of light around the smartphone 1. The illuminance is a value of light flux incident on a unit area of a measurement surface of the illuminance sensor 4. The illuminance sensor 4 is used to adjust luminance of the display 2A, for example. The proximity sensor 5 detects presence of a neighboring object in a non-contact manner. The proximity sensor 5 detects presence of an object on the basis of a change of a magnetic field, a change of a feedback time of a reflected wave of an ultrasound wave, or the like. The proximity sensor 5 detects that the touch screen display 2 is brought close to a face, for example. The illuminance sensor 4 and the proximity sensor 5 may be configured as a single sensor. The illuminance sensor 4 may be used as a proximity sensor.

The receiver 7 and the speaker 11 are sound output units. The receiver 7 and the speaker 11 output, as sounds, sound signals transmitted from a controller 10. The receiver 7 is used to output voice of a counter party during a call, for example. The speaker 11 is used to output ring alert and music, for example. One of the receiver 7 and the speaker 11 may also function as the other one of the receiver 7 and the speaker 11. The microphone 8 is a sound input unit. The microphone 8 converts voice of the user or the like to a sound signal and transmits the sound signal to the controller.

The camera 12 is an in-camera that captures an image of an object facing the front face 1A. The camera 13 is an out-camera that captures an image of an object facing the back face 1B. The camera 13 is arranged on the side face 1C1 side on the back face 1B.

The connector 14 is a terminal to which other devices are connected. The connector 14 may be a general-purpose terminal, such as a Universal Serial Bus (USB), a High-Definition Multimedia Interface (HDMI (registered trademark)), Light Peak (Thunderbolt (registered trademark)), or an earphone-microphone connector. The connector 14 may be a dedicated terminal, such as a Dock connector. Examples of the devices connected to the connector 14 include an external storage, a speaker, and a communication device, but are not limited thereto.

Figure 4:
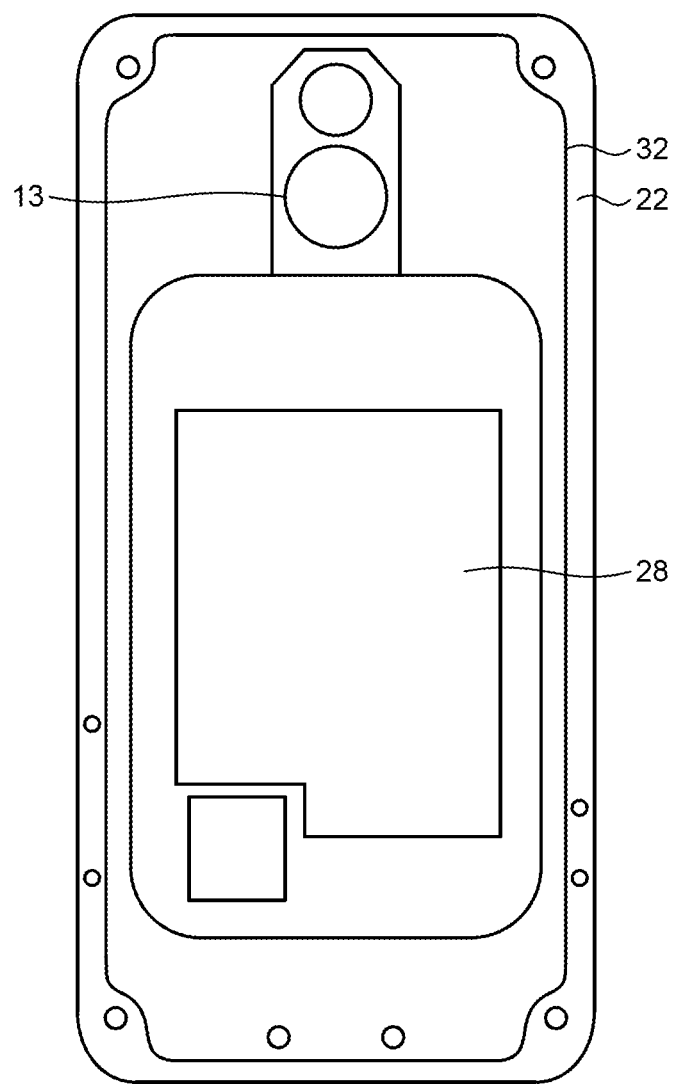
FIG. 4 is a back view of a front case of the smartphone.
Figure 5:
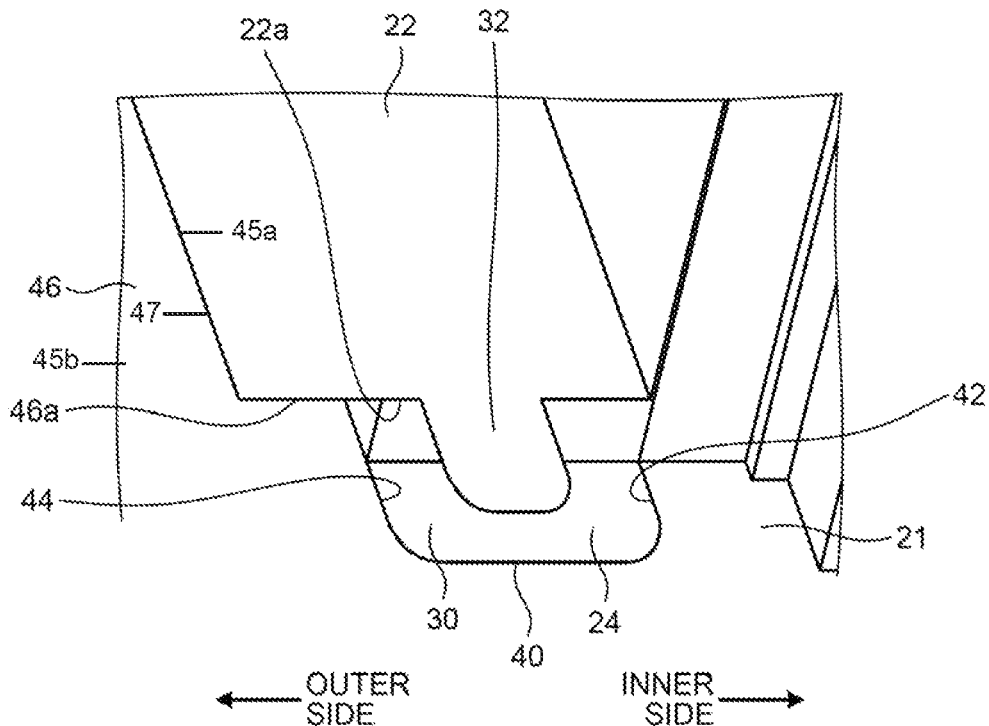
FIG. 5 is a cross-sectional view taken along a line A-A in FIG. 4.
Figure 6:
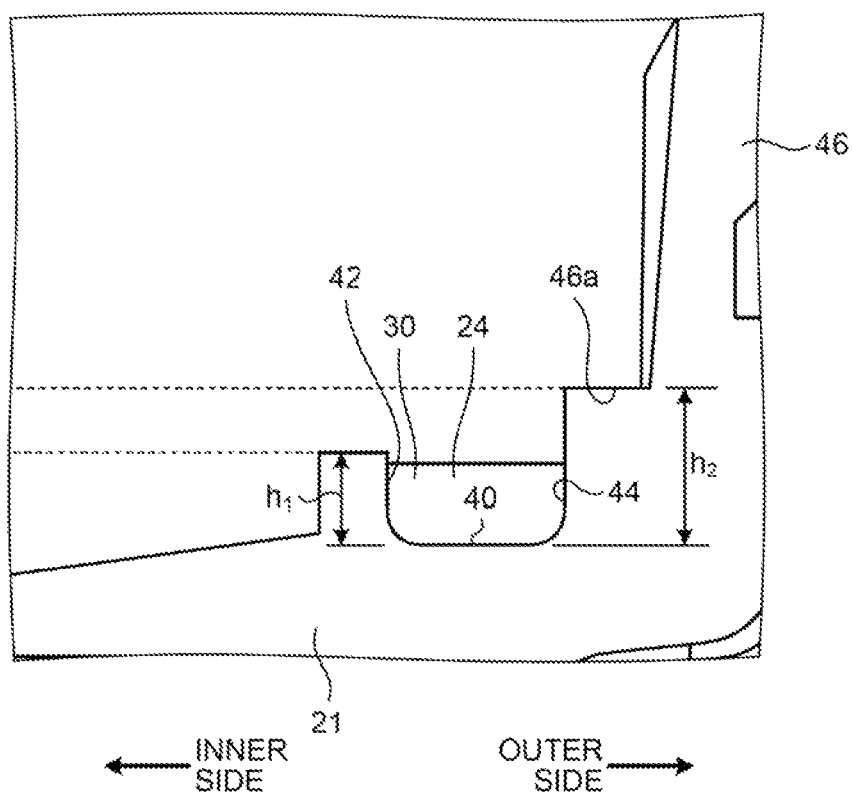
FIG. 6 is a partial cross-sectional view of a structure of a rear case and a seal member.

The housing 20 will be described with reference FIG. 4 to FIG. 6 in addition to FIG. 1 to FIG. 3. FIG. 4 is a back view of a front case of the smartphone. FIG. 5 is a cross-sectional view taken along a line A-A in FIG. 4. FIG. 6 is a partial cross-sectional view of a structure of a rear case and a seal member.

The housing 20 includes a rear case 21 as a first case, a front case 22 as a second case, a seal member 24, and fastening members 26. The rear case 21 is a member arranged on the back face 1B side. As illustrated in FIG. 3 and FIG. 5, a groove 30 in which the seal member 24 is arranged is formed along an entire outer circumference of the rear case 21. Further, a plurality of holes 31 in which the fastening members 26 are inserted are formed on a surface of the back face 1B of the rear case 21. Meanwhile, the rear case 21 may have a double structure in which a cover for hiding screw holes is additionally arranged on an outer side of a case that constitutes a waterproof structure.

The front case 22 is a member arranged on the front face 1A side. In some embodiments, the touch screen display 2, the camera 13, a substrate 28, and the like are fixed to the front case 22. The substrate 28 has an arithmetic processing function to implement functions of a control module, such as a controller, and a storage function. A rib 32 is formed at a position facing the groove 30 along an entire outer circumference of the front case 22. Further, in the front case 22, a plurality of screw holes 34 to be fastened to the fastening members 26 are arranged at positions that overlap with the holes 31.

The seal member 24 is arranged on opposing surfaces of outer circumferences of the rear case 21 and the front case 22. The seal member 24 of some embodiments comes into close contact with the groove 30 of the rear case 21. The seal member 24 is constructed by pouring and curing a liquid seal material in the groove 30. The seal member 24 is a material with hardness that is not measurable when the hardness is measured by a durometer type A. Here, if the liquid seal material is an ultraviolet (UV)-curable material, it may be possible to use, as the seal member 24, a material that is composed mainly of silicone resin and acrylic resin. If the liquid seal material is a thermoplastic material, it may be possible to use, as the seal member 24, a styrene rubber material. If the liquid seal material is a two-liquid mixing material that is cured after being poured, it may be possible to use, as the seal member 24, an ethylene propylene resin.

Shapes of the rear case 21 and the front case 22 in a region in which the seal member 24 is arranged will be described below with reference to FIG. 5. As described above, the rear case 21 includes the groove 30 with which the seal member 24 comes into contact. The rib 32 is formed in the front case 22. The seal member 24 is poured in the groove 30 and comes into contact with the rib 32.

The groove 30 is formed of a bottom face 40, a first side wall 42, and a second side wall 44. The bottom face 40 is a deepest surface of the groove 30. The bottom face 40 has curved surfaces, i.e., R-shapes, at contact positions of the first side wall 42 and the second side wall 44. The first side wall 42 and the second side wall 44 are surfaces that extend in a height direction of the groove 30. The first side wall 42 is a surface that is connected to an end portion of the bottom face 40 on an inner circumferential side. In other words, the first side wall 42 is a surface that serves as an end portion of the groove 30 on an inner side of the rear case 21. The second side wall 44 is a surface that is connected to an end portion of the bottom face 40 on an outer circumferential side. In other words, the second side wall 44 is a surface that serves as an end portion of the groove 30 on an outer side of the rear case 21.

Here, the groove 30 is configured such that where h1 represents a height of the first side wall 42 from the bottom face 40, and h2 represents a height of the second side wall 44 from the bottom face 40, h1<h2.

Further, the rib 32 is formed on an opposing surface 22a facing the rear case 21 so as to protrude toward the rear case 21 relative to other portions of the opposing surface 22a. The rib 32 is arranged on the entire area where the seal member 24 is arranged, along the groove 30. As illustrated in FIG. 5, the rib 32 partly overlaps with the groove 30 in a thickness direction of the housing 20. An end portion of the rib 32 in a width direction, i.e., an end portion of a protruding portion, has a curved surface shape, i.e., a chamfered shape. Furthermore, the opposing surface 22a that is a surface on which the rib 32 of the front case 22 is arranged comes into contact with an opposing surface 46a that is an end face of the second side wall 44 on the front case 22 side and that faces the front case 22.

As described above, the seal member 24 is poured in the groove 30, and a part of the seal member 24 comes into contact with the rib 32. It is preferable that the seal member 24 is poured up to a position substantially equal to the height of the first side wall 42 of the groove 30. The seal member 24 is deformed by being pressed by the rib 32 while being arranged in the groove 30, so that at least a predetermined amount of pressing force acts on a portion that is in contact with the rib 32. Accordingly, a space between the groove 30 and the rib 32 is sealed, so that it is possible to realize a watertight construction in a space located on the inner side relative to the seal member 24.

Further, as illustrated in FIG. 5 and FIG. 6, the rear case 21 includes an outer wall 46 that protrudes toward the front case 22 relative to the second side wall 44, on an outer side of the second side wall 44 of the groove 30, i.e., on an outer side of the groove 30. The outer wall 46 includes an inner periphery 45a and an outer periphery 45b. The groove 30 is arranged along the entire inner periphery 45a of the outer wall 46. The rib 32 is arranged along an outer periphery 47 of the front case 22 along an entire outer circumference of the front case 22. The inner periphery 45a of the outer wall 46 faces the outer periphery 47 of the front case 22. In other words, in the housing 20, the outer periphery 45b of the outer wall 46 of the rear case 21 serves as the side face 1C.

As illustrated in FIG. 3 and FIG. 4, the fastening members 26 are arranged in regions where the holes 31 and the screw holes 34 overlap with each other, and allow the rear case 21 and the front case 22 to be fastened to each other. The fastening members 26 are screws and screwed together with the screw holes 34. Among the plurality of fastening members 26, some of the fastening members 26 are arranged outside of a region sealed by the seal member 24, and others of the fastening members 26 are arranged inside the region sealed by the seal member 24. A seal mechanism, such as an O-ring, is arranged on a contact surface between the rear case 21 and the front case 22 on an outer side of the holes 31 and the screw holes 34 of the fastening members 26 that are arranged inside the region sealed by the seal member 24. With this configuration, it is possible to prevent water from entering the contact surface between the rear case 21 and the front case 22 around the fastening members 26 that are arranged inside the region sealed by the seal member 24.

Furthermore, the housing 20 may include a mechanism that is permeable to air but is not permeable to water at a hole through which an inside and an outside of a microphone are communicated.

Figure 7:
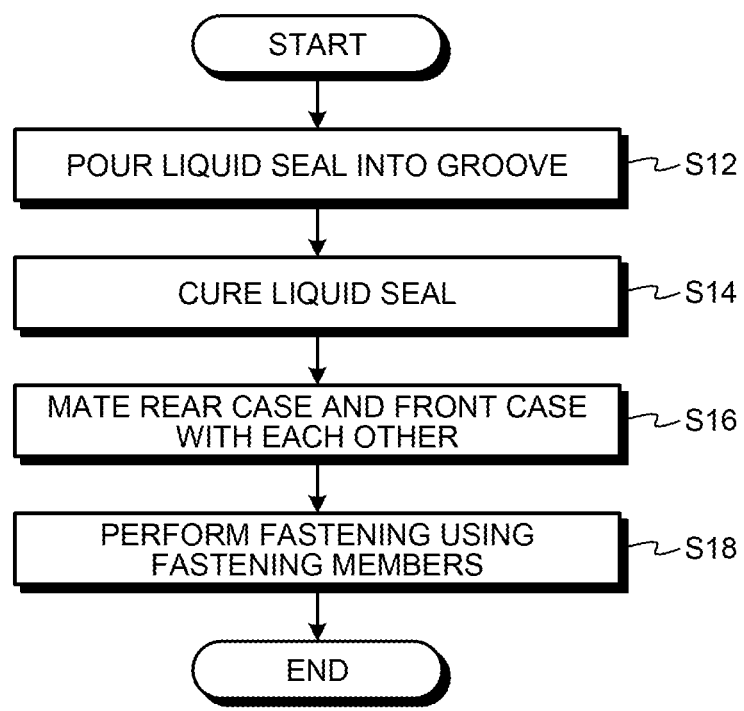
FIG. 7 is a flowchart for explaining one example of a manufacturing method.
Figure 8:
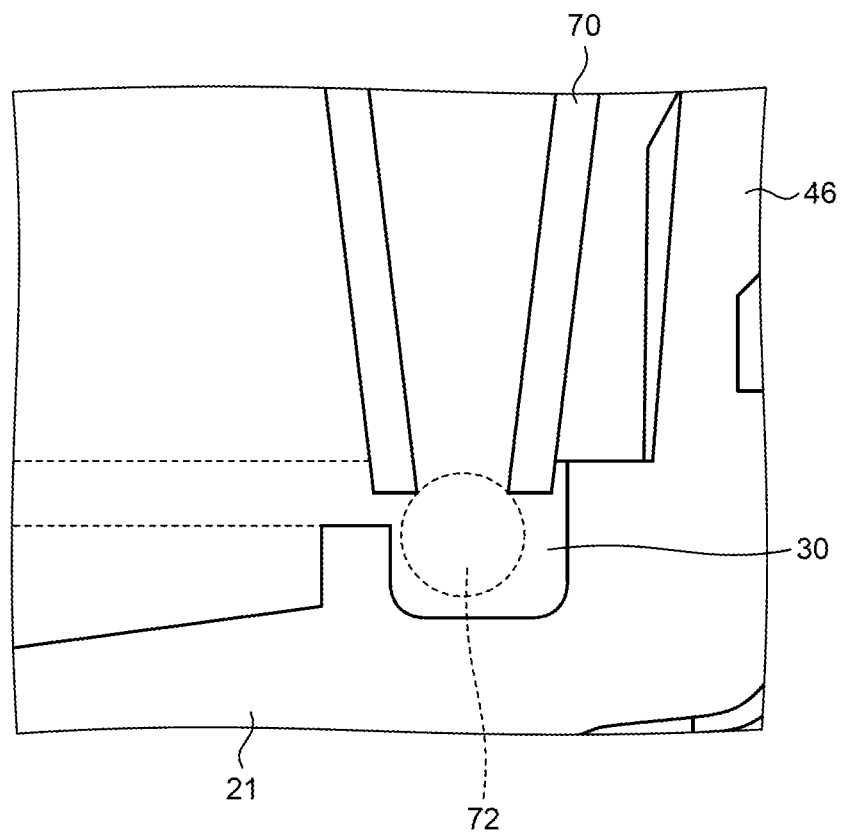
FIG. 8 is an explanatory diagram for explaining one example of the manufacturing method.

Next, with reference to FIG. 7 and FIG. 8, a manufacturing method of the smartphone will be described as one example of the electronic device manufacturing method. FIG. 7 is a flowchart for explaining one example of the manufacturing method. FIG. 8 is a diagram for explaining one example of the manufacturing method. As the manufacturing method of the smartphone 1, only a process of assembling the rear case 21 and the front case 22 is illustrated. The manufacturing method of the smartphone 1 includes a process of assembling necessary members in each of modules of the housing 20 and the like, in addition to the process as illustrated in FIG. 7. First of all, in the manufacturing method, a liquid seal material is poured in the groove 30 of the rear case 21, in which the ring-shape groove is arranged along the outer circumference (Step S12). Specifically, as illustrated in FIG. 8, a nozzle 70 filled with the liquid seal material is arranged in the vicinity of the groove 30, a liquid seal material 72 is discharged from the nozzle 70, and the nozzle 70 and the groove 30 are relatively moved in an extending direction of the groove 30, so that the liquid seal material 72 is poured in the groove 30.

In the manufacturing method, after the seal material is poured in the groove, the seal material poured in the groove 30 is cured (Step S14). If the liquid seal material is a UV-curable material, the liquid seal material is cured by being irradiated with light including UV light. If the liquid seal material is a thermoplastic material, the poured seal material is heated and cured. Further, if the liquid seal material is a two-liquid mixing material that is cured after being poured, the poured seal material is cured after a lapse of a wait time necessary for curing.

In the manufacturing method, after the seal material poured in the groove 30 is cured, the rear case 21 and the front case 22 are mated with each other (Step S16). Specifically, the front case 22, in which the rib 32 is arranged at a position facing the groove 30, is mated with the rear case 21 in such a manner that the rib 32 extends toward the bottom face 40 of the groove 30. Accordingly, the rib 32 and the seal member 24 poured in the groove 30 come into contact with each other.

In the manufacturing method, after the rear case 21 and the front case 22 are mated with each other, fastening is performed using the fastening members 26 (Step S18). Specifically, the fastening members 26 are inserted in the screw holes 34 via the holes 31, and then the fastening members 26 are tightened, so that the rear case 21 and the front case 22 are fastened together. Accordingly, relative positions of the rear case 21 and the front case 22 are located at predetermined positions, and the rib 32 is pressed to the seal member 24. If the rib 32 is pressed to the seal member 24, at least a predetermined amount of pressing force acts among the groove 30, the seal member 24, and the rib 32, so that the contact surface between the rear case 21 and the front case 22 is sealed.

As described above, by setting the height of the first side wall 42 to be lower than the second side wall 44 of the groove 30 and pouring the seal member 24 into the groove 30, it is possible to preferably fill the groove 30 that serves as a seal surface between the rear case 21 and the front case 22 with the liquid seal material.

Specifically, by setting the height of one of the side walls to be lower than the other one of the side walls, it is possible to bring the nozzle 70 for pouring the seal material close to the bottom face 40, so that it is possible to easily pour the seal material. Further, it is possible to pour the seal material with reference to the first side wall 42, so that it is possible to pour an appropriate amount of the seal material. Furthermore, the second side wall 44 gives a certain distance between the contact surface 22a and the seal member 24, so that it is possible to allow deformation of the seal member 24 that is deformed by being pressed by the rib 32 to occur inside the groove 30. Moreover, it is possible to preferably pour the liquid seal material into the groove 30, so that it is possible to bring the bottom face 40 of the groove 30 and the seal member 24 into close contact with each other with high accuracy. With this configuration, it is possible to stabilize the shape of the seal member 24, so that it is possible to maintain pressure at the time of sealing with high accuracy. Consequently, it is possible to prevent the seal member 24 from being excessively pressed, and prevent the pressing force against the seal member 24 from being reduced.

Furthermore, in the smartphone 1, a seal mechanism of the housing 20 is configured using the seal member 24, the groove 30 having different heights, and the rib 32, so that it is possible to appropriately arrange the seal member 24 in the groove 30. Moreover, the second side wall 44 gives a certain distance to the contact surface 22a, so that it is possible to allow deformation of the seal member 24 that is deformed by being pressed by the rib 32 to occur inside the groove 30. With this configuration, it is possible to stabilize the shape of the seal member 24, so that it is possible to maintain pressure at the time of sealing with high accuracy. Consequently, it is possible to prevent the seal member 24 from being excessively pressed, and prevent the pressing force against the seal member 24 from being reduced.

Furthermore, by bringing the seal member 24 into close contact with the groove 30, it is possible to stabilize the position of the seal member 24 inside the groove 30. Meanwhile, in some embodiments, the seal member 24 constructed by curing a liquid seal material is used because it is possible to simplify the manufacturing and maintain the pressure at the time of sealing in a preferable range, but embodiments are not limited thereto. It may be possible to arrange a molded ring-shape seal member, such as a packing, in the groove 30 of some embodiments. In this case, the seal member does not come into close contact with the bottom face 40.

As in some embodiments described above, it is preferable that the second side wall 44 is configured such that the opposing surface 46a that is an end portion on the front case 22 side comes into contact with the opposing surface 22a of the front case 22. With this configuration, it is possible to determine the relative positions of the front case 22 and the rear case 21 in the width direction of the housing 20 by bringing the opposing surfaces 22a and 46a in abutting contact with each other. Accordingly, it is possible to set a relative distance between the bottom face 40 and the rib 32 to a predetermined distance, so that it is possible to stabilize the pressing force that acts on the seal member 24.

Furthermore, it is preferable that a distal end of the rib 32 has a curved surface shape and the bottom face 40 of the groove 30 has a curved surface shape. In this manner, by forming portions that come into contact with the seal member 24 in rounded shapes, it is possible to prevent a force from being concentrated on a part of the seal member 24. With this configuration, it is possible to use the seal member 24 for a long time.

Moreover, as in some embodiments described above, it is preferable to configure the groove 30 in such a manner that the first side wall 42 is arranged at the end portion of the bottom face 40 on the inner circumferential side and the second side wall 44 is arranged at the end portion of the bottom face 40 on the outer circumferential side. With this configuration, it is possible to further reduce a gap between the front case 22 and the rear case 21 on the outer circumferential side, so that it is possible to further improve waterproof performance. To achieve the effects as described above, as in some embodiments described above, it is preferable that the second side wall 44 is arranged on the outer circumferential side; however, it may be possible to arrange the second side wall 44 on the inner circumferential side of the bottom face 40.

It is preferable to configure the seal member 24 in such manner that a height from the bottom face 40 is lower than that of the second side wall 44. With this configuration, even when the seal member 24 is deformed by being pressed to the rib 32, it is possible to allow the deformation of the seal member 24 to occur in the groove 30.

In some embodiments as described above, the smartphone has been described as one example of the electronic device with a waterproof structure, but a device in the appended claims is not limited to the smartphone. The device in the appended claims may be a mobile electronic device different from the smartphone. Examples of the mobile electronic device include a mobile phone, a tablet, a mobile personal computer, a digital camera, a media player, an e-book reader, a navigator, and a game player, but are not limited thereto.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic device comprising:
a housing including a first case and a second case;
the first case including a groove arranged along an entire circumference of the first case, the groove including a bottom face, a first side wall that is arranged on one end portion of the bottom face, a second side wall that is arranged on another end portion of the bottom face, and an outer wall connected to the second side wall, the outer wall including an inner periphery and an outer periphery, wherein the groove is arranged along the entire inner periphery of the outer wall,
the second case including a rib and an outer periphery, the rib is arranged along the outer periphery of the second case along an entire outer circumference of the second case,
wherein the inner periphery of the outer wall of the first case faces the entire outer periphery of the second case so as to serve as a side face of the housing, the outer wall contacts the second case in a vicinity of the rib, a height of the first side wall from the bottom face is lower than a height of the second side wall, the second case overlaps with the first case, the second case does not contact the first side wall and the rib extends toward the bottom face of the groove along entire outer circumferences of the first case and the second case; and
a seal member is sandwiched between the bottom face and the rib.

2. The electronic device according to claim 1, wherein the seal member is a cured liquid seal material.

3. The electronic device according to claim 1, wherein a first width of the groove is greater than a second width of the rib.

4. The electronic device according to claim 2, wherein the rib is configured not to contact at least one of the first side wall and the second side wall.

5. The electronic device according to claim 1, wherein the second side wall is configured such that a first surface that is an end portion on the second side wall comes into contact with at least a portion of a second surface of the second case.

6. The electronic device according to claim 1, wherein the seal member comes into contact with the groove.

7. The electronic device according to claim 1, wherein the second side wall comes into contact with the second case.

8. The electronic device according to claim 1, wherein
a distal end of the rib has a curved surface shape, and
the bottom face of the groove has a curved surface shape.

9. The electronic device according to claim 1, wherein
the first side wall is connected to an end portion of the bottom face on an inner circumferential side, and
the second side wall is connected to an opposite end portion of the bottom face on an outer circumferential side.

10. The electronic device according to claim 1, wherein a height of the seal member from the bottom face is lower than the height of the second side wall.

11. The electronic device according to claim 1, wherein the first case further comprises a first opposing surface directly connected to both the outer wall and the second side wall, the first opposing surface being flat, and the second case further comprises a second opposing surface, a first part of the second opposing surface on which the rib is arranged, a second part of the second opposing surface being flat and directly connected to the first part, at least a part of the second part facing and being in contact with the first opposing surface.

12. An electronic device comprising:
a housing including a first case and a second case;
the first case with a groove arranged along an outer circumference and an outer wall forming a side of the electronic device, the groove including a bottom face, a first side wall that is arranged on one end portion of the bottom face, a second side wall that is arranged on another end portion of the bottom face, and the outer wall connected to the second side wall, the outer wall including an inner periphery and an outer periphery, wherein the groove is arranged along the entire inner periphery of the outer wall,
the second case including a rib and an outer periphery, the rib is arranged along the outer periphery of the second case along an entire outer circumference of the second case,
wherein the inner periphery of the outer wall faces the entire outer periphery of the second case so as to serve as a side face of the housing, a height of the first side wall from the bottom face being lower than a height of the second side wall;

the second case fully housed in the first case and encircled by the outer wall, the second case not coming into contact with the first side wall and having the rib extending toward the bottom face of the groove along entire outer circumferences of the first case and the second case; and a seal member that is sandwiched between the bottom face and the rib.

13. The electronic device according to claim 12, wherein the seal member is a cured liquid seal material.

14. The electronic device according to claim 12, wherein a first width of the groove is greater than a second width of the rib.

15. The electronic device according to claim 14, wherein the rib is configured not to contact at least one of the first side wall and the second side wall.

16. The electronic device according to claim 12, wherein the seal member comes into contact with the groove.

17. The electronic device according to claim 12, wherein the second side wall comes into contact with the second case.

18. The electronic device according to claim 12, wherein a distal end of the rib has a curved surface shape, and the bottom face of the groove has a curved surface shape.

19. The electronic device according to claim 12, wherein the first side wall is connected to an end portion of the bottom face on an inner circumferential side, and the second side wall is connected to an opposite end portion of the bottom face on an outer circumferential side.

* * * * *